United States Patent
Besser et al.

(10) Patent No.: US 6,204,177 B1
(45) Date of Patent: Mar. 20, 2001

(54) METHOD OF FORMING JUNCTION LEAKAGE FREE METAL SILICIDE IN A SEMICONDUCTOR WAFER BY ALLOYING REFRACTORY METAL

(75) Inventors: Paul R. Besser, Sunnyvale; Nick Kepler, Saratoga, both of CA (US); Karsten Wieczorek, Reichenberg-Boxdorf (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/185,515

(22) Filed: Nov. 4, 1998

(51) Int. Cl.$^7$ .................................................. H01L 21/44
(52) U.S. Cl. ............................................ 438/683; 438/685
(58) Field of Search ....................................... 438/683, 685

(56) References Cited

U.S. PATENT DOCUMENTS

| | | | |
|---|---|---|---|
| 4,692,349 | * 9/1987 | Georgiou et al. | 438/655 |
| 5,302,552 | * 4/1994 | Duchateau et al. | 437/200 |
| 5,355,008 | * 10/1994 | Moyer et al. | 257/341 |
| 5,624,869 | * 4/1997 | Agnello et al. | 438/602 |
| 5,899,720 | * 5/1999 | Mikagi | 438/303 |
| 5,904,564 | * 5/1999 | Park | 438/683 |

FOREIGN PATENT DOCUMENTS 0 651 076 A1   10/1998   (EP) .

OTHER PUBLICATIONS

J. W. Mayer and S. S. Lau, Electronic Materials Science, (Macmillan, New York, 1990) pp. 335–336.*
R. V. Joshi, High Conductivity Multiphase Metal–Silicide Alloy, IBM Technical Disclosure Bulletin, vol. 30, No. 7, Dec. 1987, pp. 215–217.*
H. Jiang et al., "Ultra Shallow Junction Formation Using Diffusion From Silicides", J. Electrochem, Soc., vol. 139, No. 1, 1992, pp. 196–218.
Materials and Bulk Processes, "Doping Technologies", The National Technology Roadmap For Semiconductors, 1994, pp. 118–121.

* cited by examiner

Primary Examiner—Richard Elms
Assistant Examiner—Christian D. Wilson

(57) ABSTRACT

A method of forming metal silicide in a semiconductor wafer with reduced junction leakage introduces an alloy at cobalt grain boundaries within a cobalt layer that overlays a silicon layer. The alloy element can be precipitated during deposition of the cobalt and the alloy element, or by an intermediate anneal after deposition. The cobalt layer and the silicon layer are then annealed to form metal silicide regions. By precipitating an alloy at the cobalt grain boundaries, cobalt diffusion at the grain boundaries is retarded during a first rapid thermal annealing step. Bulk diffusion is encouraged, and a more uniform silicide film with reduced interface roughness is produced. Since the interface roughness is reduced with the methods of the present invention, junction leakage is reduced. This allows shallower junctions to be fabricated, leading to devices with improved performance.

22 Claims, 5 Drawing Sheets

METHOD OF FORMING JUNCTION LEAKAGE FREE METAL SILICIDE IN A SEMICONDUCTOR WAFER BY ALLOYING REFRACTORY METAL

FIELD OF THE INVENTION

The present invention relates to the field of semiconductor device manufacturing, and more particularly, to the formation of low resistivity self-aligned silicide regions on the gate and source/drain junctions with reduced junction leakage.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$ and $NiSi$. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both the polysilicon gate and the source/drain junction formation. After deposition, the metal blankets the polysilicon gate electrode, the oxide spacers, the oxide isolation, and the exposed source and drain electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20, comprising cobalt, for example, has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 3 in which the higher resistivity metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the suicides formed over the polysilicon and single-crystal silicon are self-aligned to each other.

Titanium is currently the most prevalent metal used for salicide processing in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European Publication No. 0651076. Cobalt silicide ($CoSi_2$) has been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as platinum or palladium are that cobalt silicide provides low resistivity, allows shallow junctions, and has a reduced tendency for forming diode-like interfaces.

The formation of $CoSi_2$ is a known two-step process. The higher resistivity phase CoSi forms during a first rapid thermal anneal step (RTA1), and the lower resistivity phase $CoSi_2$ forms during a second rapid thermal anneal step (RTA2). During the first reaction to form CoSi, cobalt is the diffusing species when the temperature is less than 500° C. In the second reaction in which $CoSi_2$ is formed, silicon is the diffusing species. As is well known, a diffusing species will always diffuse along the fastest path. In the cobalt layer deposited on the silicon, there are grain boundaries. Diffusion is faster along a grain boundary in comparison to the bulk of a grain. A schematic enlarged view of the cobalt layer and the silicon layer is depicted in FIG. 4.

The grain boundaries 25 in the cobalt layer 20 form the fastest path for cobalt to preferentially diffuse along during the first rapid thermal anneal step to form CoSi (reference numeral 24). As can be seen in FIG. 4, the areas underneath the grain boundaries 25 form a locally thicker silicide 24 and a relatively rough interface between the CoSi 24 and the underlying silicon 12. This roughness can lead to junction leakage, such as that caused by the structure depicted in FIG. 3. The junction leakage imposes a limitation as the integrated circuit industry progresses toward shallow junctions as a method for improving device switching speed.

SUMMARY OF THE INVENTION

There is a need for a method of producing ultra-shallow junctions and employing salicide technology with reduced junction leakage, allowing shallower junction fabrication and improved device performance.

This and other needs are met by embodiments of the present invention which provide a method of forming metal silicide in a semiconductor wafer with reduced junction leakage, comprising tile steps of introducing an alloy at cobalt grain boundaries within a cobalt layer that overlays a silicon layer, and annealing the cobalt layer and the silicon layer to form metal silicide regions.

By introducing an alloy at the cobalt grain boundaries, by precipitation, for example, cobalt diffusion at the grain boundaries is retarded during a first rapid thermal annealing step. Bulk diffusion is encouraged, and a more uniform silicide film with reduced interface roughness is produced. Since the interface roughness is reduced with the methods of the present invention, junction leakage is reduced. This allows shallower junctions to be fabricated, leading to devices with improved performance.

The earlier stated needs are also met by another embodiment of the present invention which provides a method of producing silicide film in a semiconductor device. The method comprises introducing an alloy at grain boundaries in a refractory metal layer that overlays a silicon layer. The metal layer and the silicon layer are treated to form silicide regions.

The earlier stated needs are met by still further embodiments of the invention, which provide a semiconductor device having silicide regions with reduced interface roughness between the silicide regions and device junctions. The semiconductor device has a refractory metal layer that has grain boundaries. An alloy is precipitated at the grain boundaries. A silicon layer underlies the refractory metal, and the junction devices are formed within the silicon layer. A silicide is formed from the refractory metal and the silicon layer.

Additional features and advantages of the present invention will become readily apparent to those skilled in the art from the following detailed description, when embodiments of the invention are described, simply by way of illustration of the best mode contemplated for carrying out the invention. As will be realized, the invention is capable of other and different embodiments and its several details are capable of modifications and various obvious respects, all without departing from the invention. Accordingly, the drawings and description are to be regarded as illustrative in nature, and not as restrictive.

DETAILED DESCRIPTION OF THE INVENTION

The present invention reduces junction leakage, allowing for shallower junction formation and increased device performance. The invention achieves this in certain embodiments by introducing an alloying element into the metal refractory layer deposited on the silicon layer. The alloy is made to precipitate at the grain boundaries in the metal refractory layer. The precipitated alloy retards metal diffusion (e.g., cobalt diffusion) at the grain boundaries during a rapid thermal annealing step to form a higher resistivity phase of a metal silicide. By retarding cobalt diffusion along the grain boundaries when forming CoSi, a locally thicker silicide and a rough interface between the CoSi and the underlying silicon is avoided.

Figure 1:
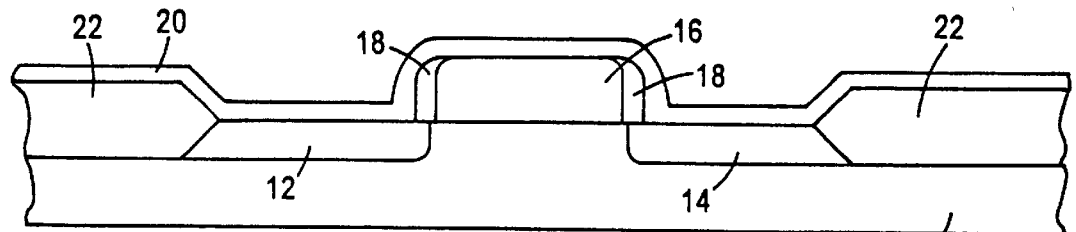
FIG. 1 is a cross-section of a portion of a semiconductor wafer processed in accordance with the prior art during one step of a salicide process.
Figure 2:
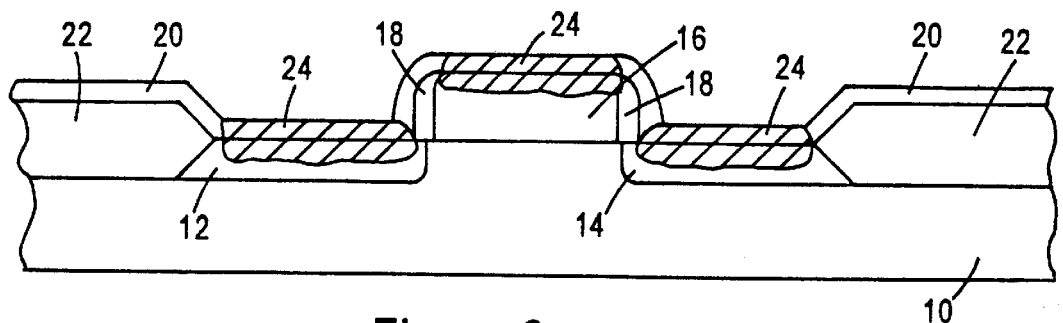
FIG. 2 depicts the cross-section of FIG. 1 after a first rapid thermal anneal step to form a high resistivity metal silicide region in accordance with the prior art.
Figure 3:
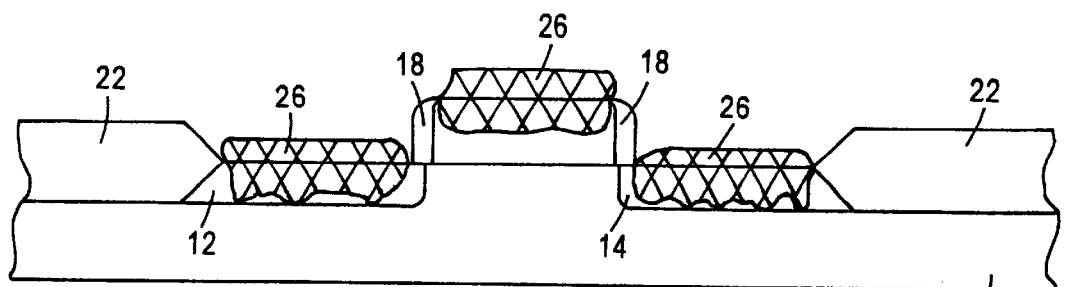
FIG. 3 is a cross-section of the semiconductor wafer of FIG. 2 following a second rapid thermal annealing step to form lower resistivity metal silicide regions in accordance with the prior art.
Figure 4:
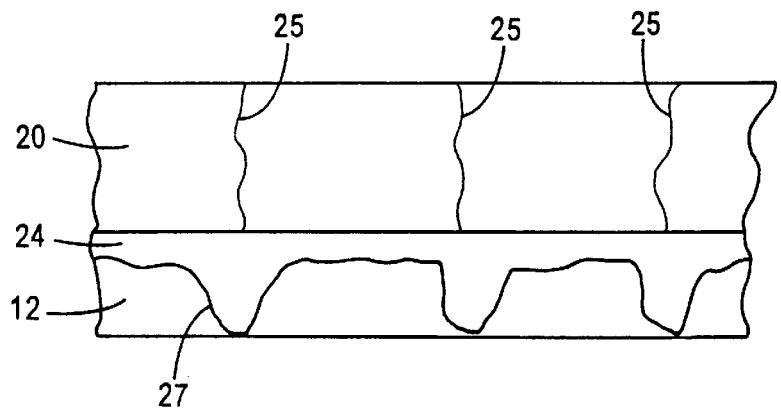
FIG. 4 is an enlarged cross-section schematically depicting an exemplary silicide and silicon interface in a semiconductor wafer processed in accordance with the prior art.
Figure 5:
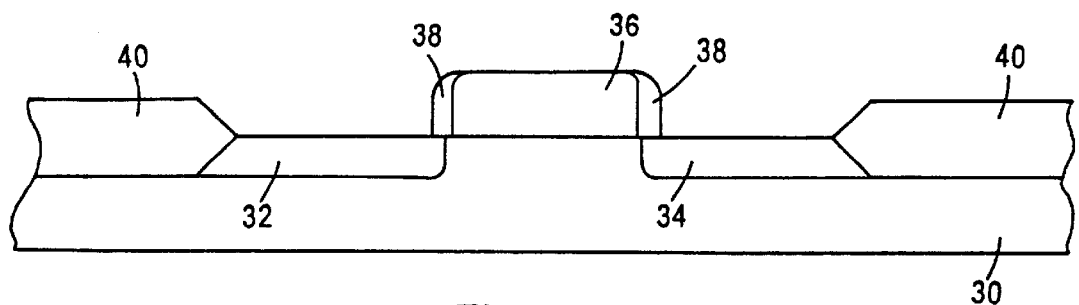
FIG. 5 is a cross-section of a portion of a semiconductor wafer prior to a salicidation process in accordance with certain embodiments of the present invention.
Figure 6:
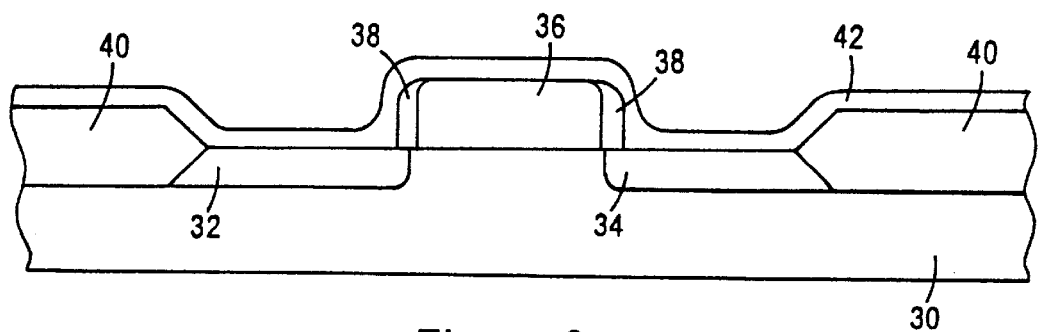
FIG. 6 is a depiction of the semiconductor device of FIG. 4, following the application of a metal layer, such as cobalt, and an alloy, in accordance with certain embodiments of the present invention.

FIG. 5 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

A layer of refractory metal 42 is then deposited uniformly across the entire wafer, preferably using physical vapor deposition from a sputtering target and a commercially available ultra-high-vacuum, multi-chamber, DC magnetron sputtering system. In certain preferred embodiments, the metal is cobalt (Co). Cobalt has a number of advantages over other types of metals. For example, in comparison to silicon, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only.

Figure 12:
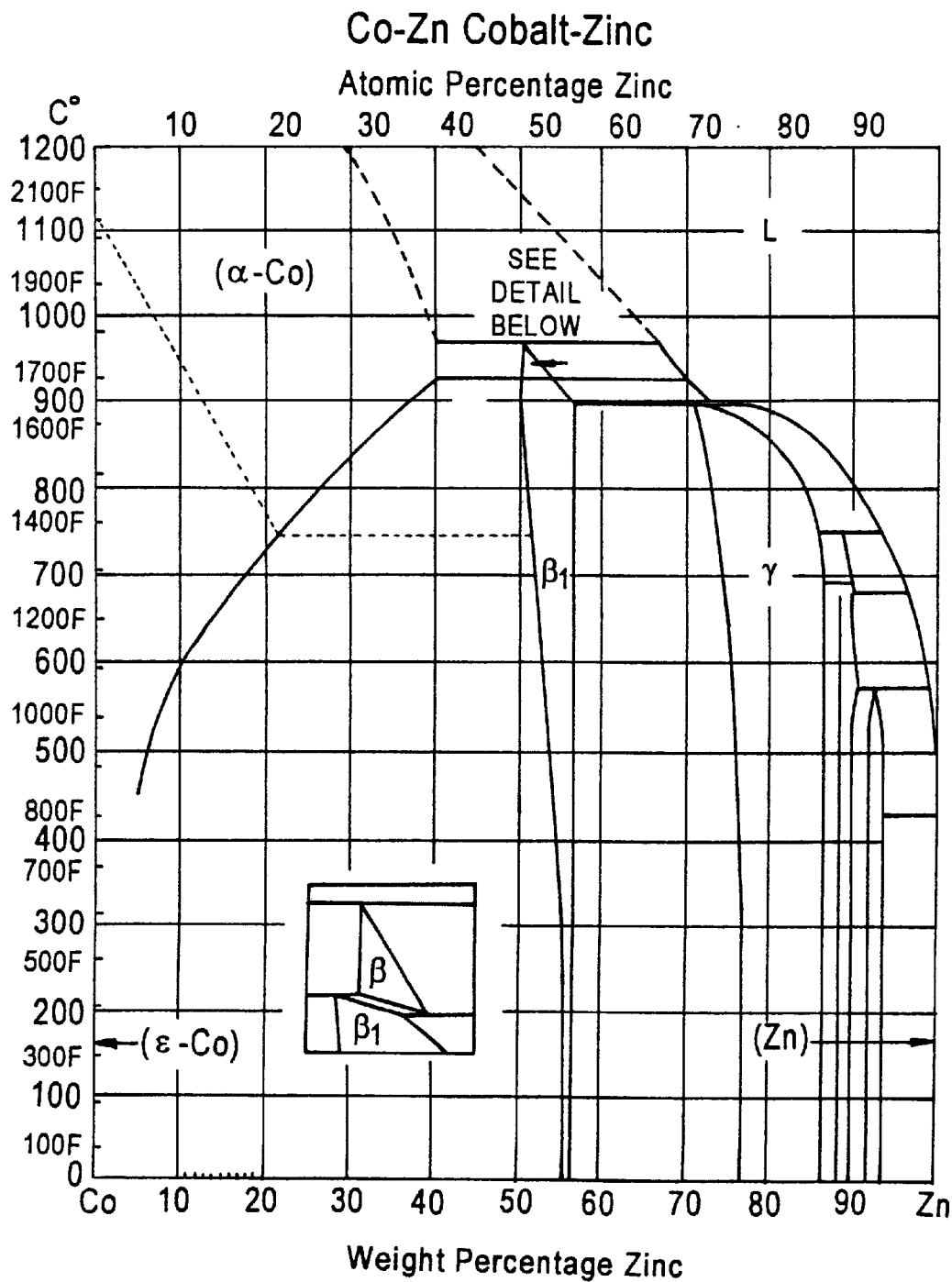
FIG. 12 is an exemplary binary phase diagram depicting the phases of the metal and the alloy as relating to temperature.

In certain preferred embodiments of the invention, an alloying element is introduced into the refractory metal (e.g., cobalt) sputtering target. Examples of suitable alloys are Zn, Mg, In, Te, Ga, Ge and Ta. The alloying element is deposited with the refractory metal in the refractory metal layer 42. In certain embodiments of the invention, the alloy elements precipitate at the grain boundaries of the refractory metal during deposition of the refractory metal layer 42. In other embodiments of the present invention, an annealing step is performed immediately after the deposition of the refractory metal and the alloy elements. The annealing temperature to cause precipitation is lower than the first rapid thermal anneal temperature, in order to ensure precipitation of the alloy at the grain boundaries prior to the formation of the higher resistivity metal silicide. The precipitation anneal temperature is selected based on the binary phase diagram for the metal and the alloy element. An exemplary binary phase diagram is depicted in FIG. 12. For example, where cobalt is the refractory metal layer and Zn is the alloy element, an appropriate precipitation anneal temperature is 200–300° C.

Figure 7:
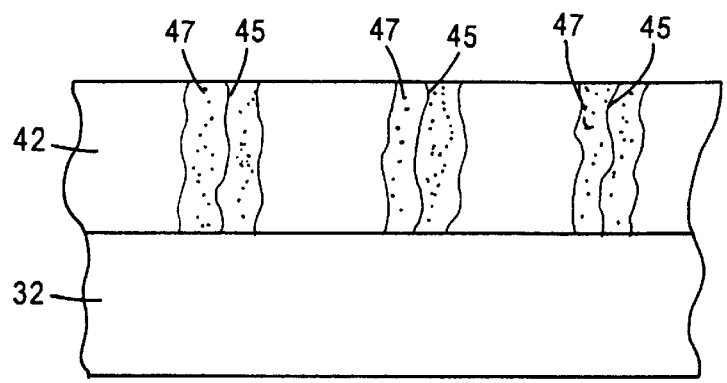
FIG. 7 is an enlarged cross-section schematically depicting the grain boundaries in the metal layer with the alloy precipitated at the grain boundaries, in accordance with certain embodiments of the present invention.

FIG. 7 is an enlarged cross-section of a portion of the metal refractory layer 43 and one of the source/drain junctions 32, following precipitation of the alloy elements, either during deposition or after precipitation annealing. The metal layer 42 exhibits a number of grain boundaries 45. The alloy elements are depicted as located in regions 47 precipitated at the metal grain boundaries 45. Since the metal layer 42 and the silicon of the source/drain junction 32 has not been exposed to the higher temperature rapid thermal anneal at this point in the process, silicide has not yet formed. The alloy elements in the region 47 will retard the metal diffusion at the grain boundaries during the higher temperature rapid thermal anneal (RTA1) that forms the higher resistivity phase metal silicide. Bulk diffusion of the metal (e.g., cobalt) is encouraged. As will be described later and seen in FIG. 11, this has the effect of providing a more uniform silicide film with reduced interface roughness.

Figure 8:
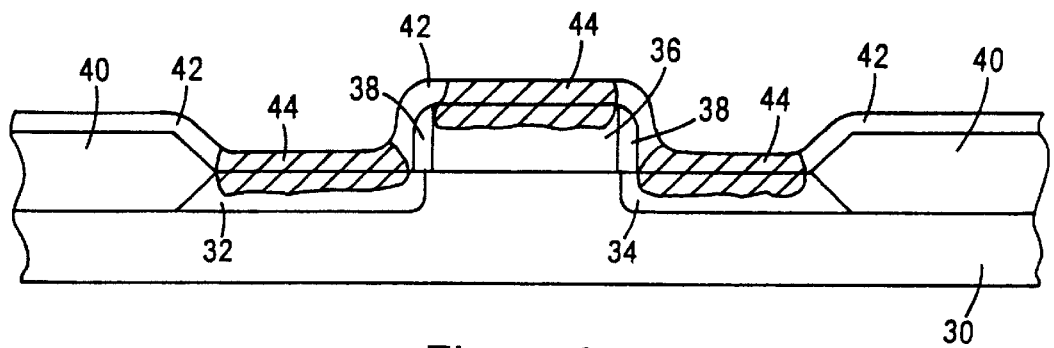
FIG. 8 depicts the semiconductor device of FIG. 6 following a first rapid thermal anneal step to form high resistivity metal silicide regions in accordance with embodiments of the present invention.

FIG. 8 depicts the semiconductor device of FIG. 5 after the formation of high resistivity metal silicide regions. In certain preferred embodiments, the high resistivity metal silicide regions 44 are created by a rapid thermal anneal step (RTA1). The high resistivity metal suicide regions 44 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 8, some of the silicon in the source and drain junctions 32, 34 is consumed during the first rapid thermal annealing step to become part of the high resistivity metal silicide regions 44. This is true also for the silicon in the polysilicon gate 36.

Figure 10:
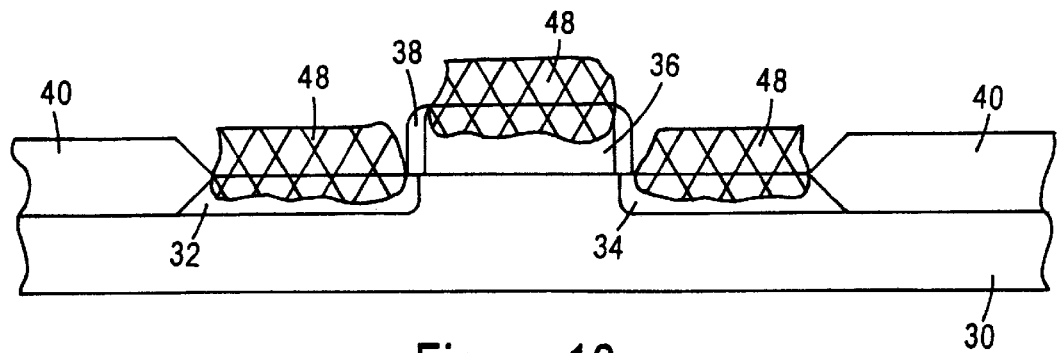
FIG. 10 is a depiction of the semiconductor device of FIG. 8 after a second rapid thermal annealing is performed to form lower resistivity metal silicide regions, in accordance with embodiments of the present invention.
Figure 11:
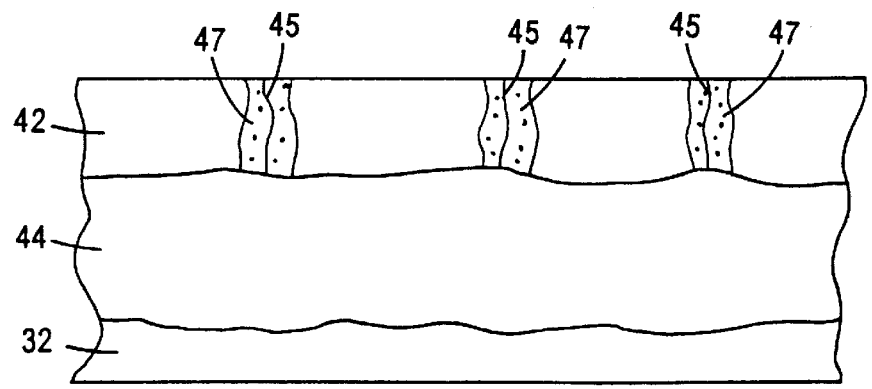
FIG. 11 is an enlarged cross-section schematically depicting the region depicted in FIG. 7, following the formation of the lower resistivity metal silicide regions as depicted in FIG. 10 in accordance with certain embodiments of the present invention.

An enlarged cross-section of a portion of the metal layer and one of the source/drain junction 32 following the first rapid thermal anneal step to form silicide (RTA1) is depicted in FIG. 11. In the embodiments in which cobalt is the metal in the metal layer 41, the cobalt is the diffusing species in the reaction and the CoSi phase metal silicide region 44 is formed at the interface between the metal layer 42 and the silicon in the source/drain junction 32. Due to the alloy precipitation regions 47 at the cobalt grain boundaries 45, the silicide film 44 can be seen to be more uniform (in comparison with the prior art), and exhibits a reduced interface roughness between the silicide and the silicon of the source/drain junction. This allows the low resistivity phase metal silicide to also exhibit a reduced interface roughness following the second rapid thermal anneal step (RTA2), as will be shown in FIG. 10.

Figure 9:
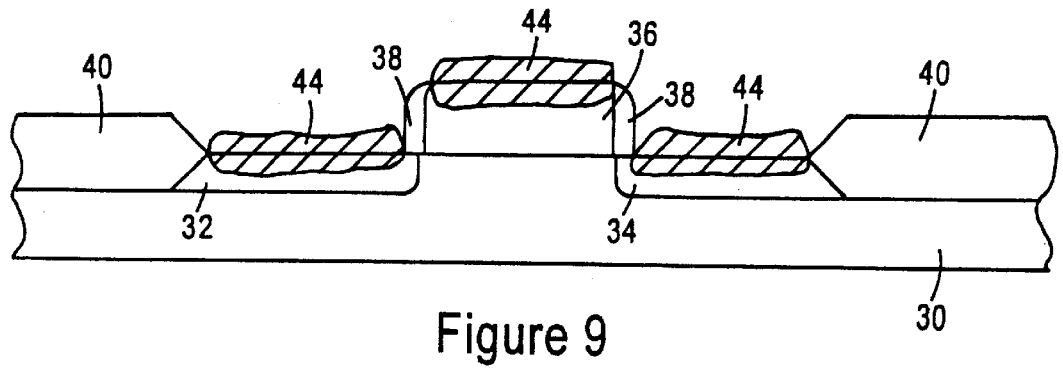
FIG. 9 depicts the semiconductor device of FIG. 6 following a selective etch that removes unreacted metal in accordance with embodiments of the present invention.

Following the first rapid thermal anneal (RTA1) to form the first phase metal silicide, a selective etch is performed to remove any unreacted refractory metal, such as cobalt. A typical etchant employed to remove unreacted cobalt is $3HCl:H_2O_2$. Removal of the unreacted metal by the peroxide solution leaves the silicide regions 44 intact. The resultant structure is depicted in FIG. 9.

A second rapid thermal anneal step (RTA2) is then performed to produce lower resistivity metal silicide regions 48, as depicted in FIG. 10. This second rapid thermal anneal step exposes the semiconductor wafer to a higher temperature than employed in the first rapid thermal anneal step. A temperature in this second rapid thermal anneal step is between about 600° C. and 850° C., and preferably is 800° C. The semiconductor wafer is exposed to the high temperature for between about 5 and about 90 seconds.

Silicon is the diffusing species in the reaction during the second rapid thermal anneal step, in which the high resistivity phase of cobalt silicide (CoSi) is transformed to the low resistivity phase ($CoSi_2$), so that silicon from the silicon layer 46 is consumed. However, the silicon in the source/drain junction 32, 34 will be consumed more uniformly across the junction in this step, since the interface created during the first rapid thermal annealing is relatively smooth. The relative smoothness of the interface is due to the introduction of the alloy elements at the grain boundaries 45. Significantly, the low resistivity metal silicide regions 48, as depicted in FIG. 10, do not reach the bottom of the source/drain junctions 32, 34. Hence, the junction leakage problem is avoided with the embodiments of the present invention. Shallower junctions may therefore be employed, with a concomitant increase in device performance.

The embodiments of the present invention allow ultra-shallow junction to be formed and employed in a semiconductor device with a low resistivity metal silicide, such as cobalt ($CoSi_2$) while avoiding junction leakage due to interface roughness at the grain boundaries in the metal layer. This permits faster devices and better performance of the semiconductor device. An exemplary embodiment has been described in which cobalt is employed as the refractory metal in forming the silicide. However, tile present invention finds utility in other applications employing other materials in the formation of a silicide, where the metal is tile diffusing species.

Only certain preferred embodiments of the present invention and but a few examples of its versatility are shown and described in the present disclosure. It is to be understood that the present invention is capable of using various other combinations and environments is capable of chances and modifications within the scope of the invention concept has expressed herein.

What is claimed is:

1. A method of forming metal silicide in a semiconductor wafer with reduced junction leakage, comprising the steps of:

introducing an alloy at cobalt grain boundaries within a cobalt layer that overlays a silicon layer, the alloy selected from the group consisting of Zn, Mg, Te, Ga, and Ge; and annealing the cobalt layer and the silicon layer to form metal silicide regions.

2. The method of claim 1, wherein the step of introducing includes precipitating the alloy at the grain boundaries.

3. The method of claim 2, wherein the step of precipitating the alloy includes depositing cobalt and the alloy simultaneously on the silicon layer, the alloy precipitating at the cobalt grain boundaries.

4. The method of claim 2, wherein the step of precipitating the alloy includes: depositing cobalt and the alloy on the silicon layer; and annealing the cobalt layer to precipitate the alloy at the cobalt grain boundaries.

5. The method of claim 4, wherein the step of annealing the cobalt layer to precipitate the alloy is performed at a lower temperature than the temperature at which the annealing of the cobalt layer and the silicon layer to form the silicide regions is performed.

6. The method of claim 5, wherein the step of annealing the cobalt layer to precipitate the alloy is performed at a temperature between about 200° C. and about 300° C.

7. The method of claim 1, wherein the concentration of the alloy relative to the cobalt is between about 0.1 and about 5 weight %.

8. The method of claim 1, further comprising depositing the cobalt and the alloy on the silicon layer by sputtering with a sputtering target comprising cobalt and the alloy.

9. The method of claim 1, wherein the alloy element is Zn.

10. A method of producing silicide film in a semiconductor device, comprising the steps of:

introducing an alloy at grain boundaries in a refractory metal layer that overlays a silicon layer, the alloy selected from the group consisting of Zn, Mg, In, Te, Ga, and Ge; and treating the metal layer and the silicon layer to form silicide regions.

11. The method of claim 10, wherein the refractory metal is cobalt.

12. The method of claim 11, wherein the step of treating the metal layer includes annealing the metal layer and the silicon layer.

13. The method of claim 10, wherein the step of introducing includes precipitating the alloy at the grain boundaries.

14. The method of claim 13, wherein the step of precipitating the alloy includes depositing cobalt and the alloy simultaneously on the silicon layer, the alloy precipitating at the cobalt grain boundaries.

15. The method of claim 13, wherein the step of precipitating the alloy includes: depositing cobalt and the alloy on the silicon layer; and annealing the cobalt layer to precipitate the alloy at the cobalt grain boundaries.

16. The method of claim 15, wherein the step of annealing the cobalt layer to precipitate the alloy is performed at a lower temperature than the temperature at which the annealing of the cobalt layer and the silicon layer to form the silicide regions is performed.

17. The method of claim 16, wherein the step of annealing the cobalt layer to precipitate the alloy is performed at a temperature between about 200° C. and about 300° C.

18. The method of claim 10, wherein the concentration of the alloy relative to the cobalt is between about 0.1% and about 5 weight %.

19. The method of claim 10, further comprising depositing the cobalt and the alloy on the silicon layer by sputtering with a sputtering target comprising cobalt and the alloy.

20. The method of claim 10, wherein the alloy element is Zn.

21. A method of producing silicide film in a semiconductor device, comprising the steps of:

introducing an alloy selected from the group consisting of Zn, Mg, In, Te, Ga, and Ge at grain boundaries in a refractory metal layer that overlays a silicon layer by precipitating the alloy at the grain boundaries; and treating the metal layer and the silicon layer to form silicide regions;

wherein the step of precipitating the alloy includes: depositing cobalt and the alloy on the silicon layer, and annealing the cobalt layer to precipitate the alloy at the cobalt grain boundaries at an annealing temperature of 200° C. to 300° C., this annealing temperature being a lower temperature than the temperature at which the treatment of the metal layer and the silicon layer to form the silicide regions is performed.

22. The method of claim 21, wherein the alloy element is Zn.

* * * * *

UNITED STATES PATENT AND TRADEMARK OFFICE
CERTIFICATE OF CORRECTION

PATENT NO. : 6,204,177 B1
DATED : March 20, 2001
INVENTOR(S) : Paul R. Besser, et al.

Page 1 of 1

It is certified that error appears in the above-identified patent and that said Letters Patent is hereby corrected as shown below:

Claim 1,
Line 6, after "Mg,", insert -- In --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*